(12) United States Patent
Hwang et al.

(10) Patent No.: US 7,486,284 B2
(45) Date of Patent: Feb. 3, 2009

(54) DRIVER CHIP AND DISPLAY APPARATUS HAVING THE SAME

(75) Inventors: Seong-Yong Hwang, Yongin-si (KR); Weon-Sik Oh, Osan-si (KR); Sung-Lak Choi, Osan-si (KR); Chun-Ho Song, Seoul (KR); Ju-Young Yoon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 656 days.

(21) Appl. No.: 11/011,746

(22) Filed: Dec. 15, 2004

(65) Prior Publication Data

US 2005/0195130 A1  Sep. 8, 2005

(30) Foreign Application Priority Data

Dec. 15, 2003  (KR) .................. 10-2003-0091364

(51) Int. Cl.
G09G 5/00  (2006.01)

(52) U.S. Cl. .................. 345/204; 345/206; 345/214

(58) Field of Classification Search ............... 345/36, 345/206, 78, 690, 100, 98, 55, 204, 76, 82, 345/214, 104; 315/169.4; 348/218.1; 349/149, 349/150, 40, 151, 39; 438/119, 612; 257/668, 257/59, 684
See application file for complete search history.

(56) References Cited

U.S. PATENT DOCUMENTS

| | | | | |
|---|---|---|---|---|
| 5,335,002 A | * | 8/1994 | Nagahata et al. ............. | 347/209 |
| 5,386,228 A | * | 1/1995 | Okino ...................... | 348/218.1 |
| 5,532,723 A | * | 7/1996 | Nagahata et al. ............ | 347/209 |
| 5,572,346 A | * | 11/1996 | Sakamoto et al. ........... | 349/150 |
| 5,585,666 A | * | 12/1996 | Imamura .................... | 257/668 |
| 5,712,493 A | * | 1/1998 | Mori et al. ..................... | 257/59 |
| 6,037,654 A | * | 3/2000 | Tamura ...................... | 257/668 |
| 6,172,732 B1 | * | 1/2001 | Hayakawa et al. .......... | 349/152 |
| 6,194,960 B1 | * | 2/2001 | Nagumo .................... | 327/565 |
| 6,204,567 B1 | * | 3/2001 | Imamura .................... | 257/797 |
| 6,262,541 B1 | * | 7/2001 | Asai ........................ | 315/169.4 |
| 6,297,868 B1 | * | 10/2001 | Takenaka et al. ............ | 349/151 |
| 6,388,719 B1 | * | 5/2002 | Matsunaga et al. ........... | 349/40 |
| 6,411,359 B1 | * | 6/2002 | Kobayashi et al. .......... | 349/149 |
| 6,507,384 B1 | * | 1/2003 | Endo et al. .................. | 349/149 |
| 6,699,737 B2 | * | 3/2004 | Tojo et al. ................... | 438/119 |
| 6,963,385 B2 | * | 11/2005 | Aruga et al. ................. | 349/151 |
| 6,984,027 B2 | * | 1/2006 | Sakaida et al. ................ | 347/68 |
| 6,992,001 B1 | * | 1/2006 | Lin ............................. | 438/612 |

(Continued)

OTHER PUBLICATIONS

TMS370, May 1995, USA, Texas Instrumnets Mechanical data for plastic chip carrier and ceramic chip carrier.*

*Primary Examiner*—Prabodh M. Dharia
(74) *Attorney, Agent, or Firm*—Cantor Colburn LLP

(57) ABSTRACT

A driver chip includes a base body, an input terminal section and a first output terminal section. The base body includes a face having a long side and a short side. The input terminal section is formed at a first edge portion of the face along the long side. The first output terminal section is formed at a second edge portion that is opposite to the first edge portion. The input terminal section and the first output terminal section are disposed within about 9d/10 from a center of the long side toward the short side, wherein 'd' represents a distance between the center of the long side and the short side.

22 Claims, 11 Drawing Sheets

U.S. PATENT DOCUMENTS

| | | | |
|---|---|---|---|
| 7,061,117 B2 * | 6/2006 | Yang et al. | 257/773 |
| 7,069,416 B2 * | 6/2006 | Kirsch | 712/13 |
| 7,149,090 B2 * | 12/2006 | Suzuki et al. | 361/762 |
| 7,262,083 B2 * | 8/2007 | Tojo et al. | 438/119 |
| 7,323,814 B2 * | 1/2008 | Miyazaki et al. | 313/495 |
| 2001/0009299 A1 * | 7/2001 | Saito | 257/684 |
| 2003/0068842 A1 * | 4/2003 | Tojo et al. | 438/119 |
| 2003/0164843 A1 * | 9/2003 | Sakaguchi | 345/690 |
| 2007/0216822 A1 * | 9/2007 | Ishige et al. | 349/39 |

* cited by examiner

DRIVER CHIP AND DISPLAY APPARATUS HAVING THE SAME

CROSS-REFERENCE TO RELATED APPLICATIONS

This application relies for priority upon Korean Patent Application No. 2003-91364 filed on Dec. 15, 2003, the contents of which are herein incorporated by reference in its entirety.

BACKGROUND OF THE INVENTION

1. Field of the Invention

The present invention relates to a driver chip and a display apparatus having the driver chip. More particularly, the present invention relates to a driver chip capable of enhancing a reliability of a connection between the driver chip and a display panel, and a display apparatus having the driver chip.

2. Description of the Related Art

Generally, a mobile telecommunication device, a digital camera, a notebook PC, a monitor, etc., require a display apparatus. Various kinds of a display apparatus may be employed. However, flat panel display apparatuses, for example a liquid crystal display apparatus, are widely used due to their merits.

The liquid crystal display apparatus displays images by using liquid crystal. The liquid crystal display apparatus is thin and light, and the liquid crystal display apparatus has low power consumption and driving voltage.

A conventional liquid crystal display apparatus includes a liquid crystal display panel that displays images and a driver chip that drives the liquid crystal display panel.

The driver chip converts external image data into driving signals to apply the driving signals to the liquid crystal display panel. The driver chip may be electrically connected to the liquid crystal display panel in various ways.

Recently, in order to reduce size and manufacturing cost, a chip on glass (COG) process is widely employed. According to the COG process, the driver chip is mounted directly on the liquid crystal display panel. In detail, an anisotropic conductive film (ACF) is interposed between the driver chip and the liquid crystal display panel to be compressed at a high temperature. Therefore, the driver chip and the liquid crystal display panel are electrically connected to each other.

Although the COG process is effective for connecting terminals of the driver chip to the liquid crystal display panel, the driver chip may be warped due to a difference between thermal expansion coefficients of the driver chip and the liquid crystal display panel. Additionally, a stress may be induced at the driver chip. Therefore, defects of electric connection between the driver chip and the liquid crystal display panel may occur.

SUMMARY OF THE INVENTION

The present invention provides a driver chip capable of enhancing a reliability of connection between the driver chip and the liquid crystal display panel.

The present invention also provides a display apparatus having the driver chip.

In an exemplary driver chip according to the present invention, the driver chip includes a base body, an input terminal section and a first output terminal section. The base body includes a face having a long side and a short side. The input terminal section is formed at a first edge portion of the face along the long side. The first output terminal section is formed at a second edge portion that is opposite to the first edge portion along the short side. The first output terminal section is formed along the long side. The input terminal section and the first output terminal section are disposed within about 9d/10 from a center of the long side toward the short side, wherein 'd' represents a distance between the center of the long side and the short side.

In another exemplary driver chip according to the present invention, the driver chip includes a base body, an input terminal section, a first output terminal section and a dummy terminal section. The base body includes a long side and a short side that is substantially perpendicular to the long side. The input terminal section is formed at a first edge of the base body along the long side. The first output terminal section is formed at a second edge that is opposite to the first edge along the short side. The first output terminal section is formed along the long side. The dummy terminal section is formed at a side of the first output terminal section along the long side.

In an exemplary display apparatus according to the present invention, the display apparatus includes a driver chip and a display panel. The driver chip includes a base body, an input terminal section and a first output terminal section. The base body includes a face having a long side and a short side. The input terminal section is formed at a first edge portion of the face along the long side. The first output terminal section is formed at a second edge portion that is opposite to the first edge portion along the short side. The first output terminal section is formed along the long side. The input terminal section and the first output terminal section are disposed within about 9d/10 from a center of the long side toward the short side, wherein 'd' represents a distance between the center of the long side and the short side. The display panel includes a conducting line for transferring an electric signal and a pad section through which the driver chip is electrically connected to the conducting line.

According to the present invention, input terminals and output terminals are formed on other region than an edge portion of a base body, on which stress is concentrated. Therefore, a reliability of electric connection between a driver chip and a display panel is enhanced.

BRIEF DESCRIPTION OF THE DRAWINGS

The above and other features and advantage points of the present invention will become more apparent by describing in detailed exemplary embodiments thereof with reference to the accompanying drawings, in which.

DESCRIPTION OF EMBODIMENTS

Hereinafter, the embodiments of the present invention will be described in detail with reference to the accompanied drawings.

Embodiments of a Driver Chip

Embodiment 1

Figure 1:
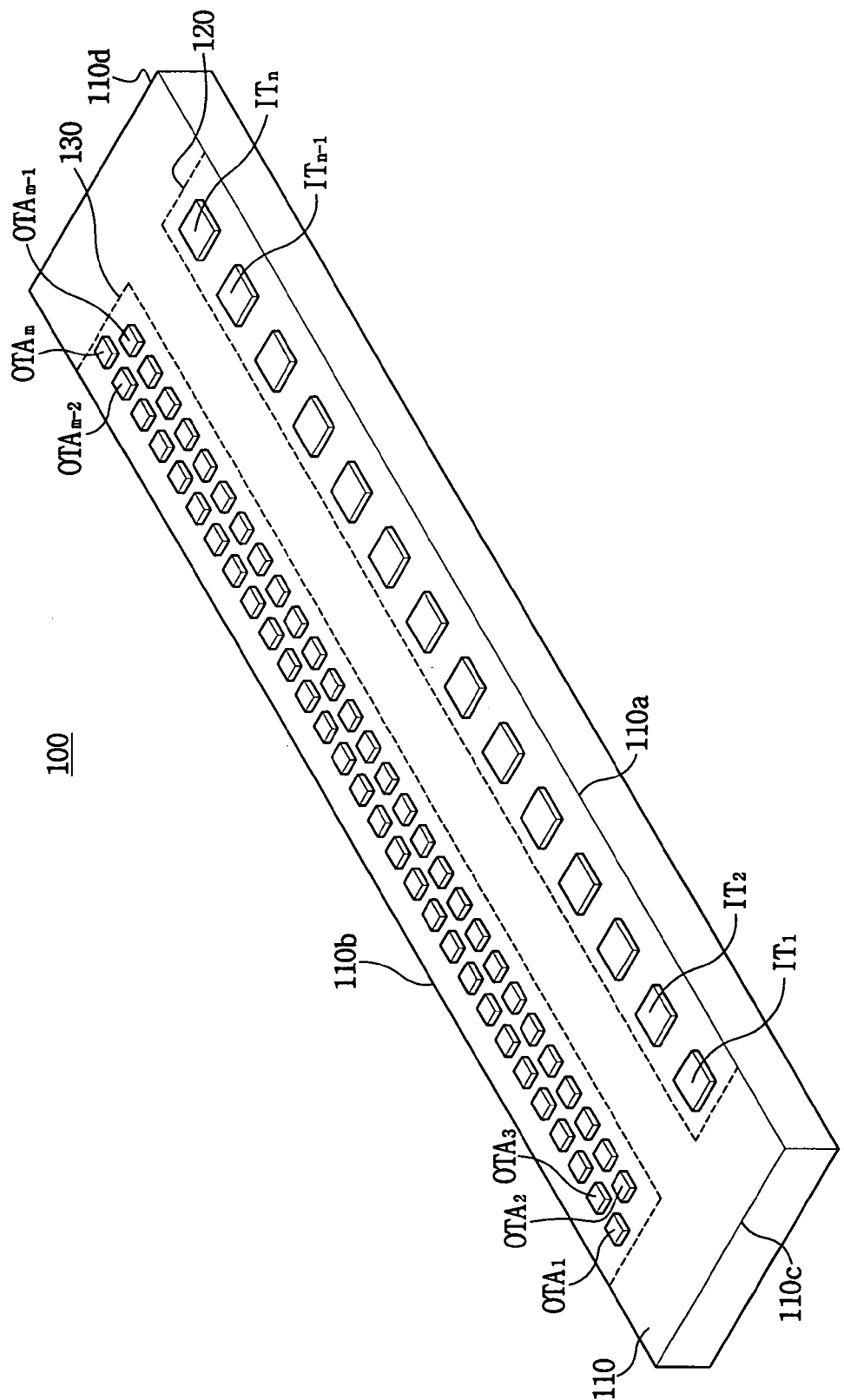
FIG. 1 is a perspective view illustrating a driver chip according to a first exemplary embodiment of the present invention.

FIG. 1 is a perspective view illustrating a driver chip according to a first exemplary embodiment of the present invention.

Referring to FIG. 1, a driver chip 100 according to a first exemplary embodiment of the present invention includes a base body 110, an input terminal section 120 and a first output terminal section 130.

The base body 110 includes an insulating material, and the base body 110 has a parallel piped shape including a face. The face has first and second long sides 110a and 110b, and first and second short sides 110c and 110d that are substantially perpendicular to the first and second long sides 110a and 110b. A semiconductor device (not shown) for converting an external image signal into a driver signal is formed in the base body 110.

The input terminal section 120 is formed on a first edge portion of the face of the base body 110 along the first long side 110a. The input terminal section 120 includes n-number of input terminals $IT_1$-$IT_n$, wherein 'n' is a natural number no less than 2. The input terminals $IT_1$-$IT_n$ are arranged in a single line along the first long side 110a.

The first output terminal section 130 is formed on a second edge portion of the face of the base body 110 along the second long side 110b. The first and second edge portions are space apart from each other. The first output terminal section 130 includes m-number of output terminals $OTA_1$-$OTA_m$, wherein 'm' is a natural number no less than 2. The output terminals $OTA_1$-$OTA_m$ are arranged in two lines along the second long side 110b. The first output terminals arranged in a first line are spaced apart from each other, and each of the first output terminals arranged in a second line that is substantially parallel with the first line is disposed between the first output terminals arranged in the first line.

However, the first output terminals $OTA_1$-$OTA_m$ may be arranged in a single line, or the first output terminals $OTA_1$-$OTA_m$ may be arranged in more than two lines.

The driver chip 100 is mounted directly on a display panel (not shown) through COG process. In the COG process, the driver chip 100 is heated. When the driver chip 100 is cooled down, the driver chip 100 is warped due to a difference in thermal expansion coefficients between the driver chip 100 and the display panel. The driver chip 100 is also under stress. The stress may be classified into a shear stress and a normal stress, and the shear and normal stresses may be simulated by Suhir's model.

Figure 2:
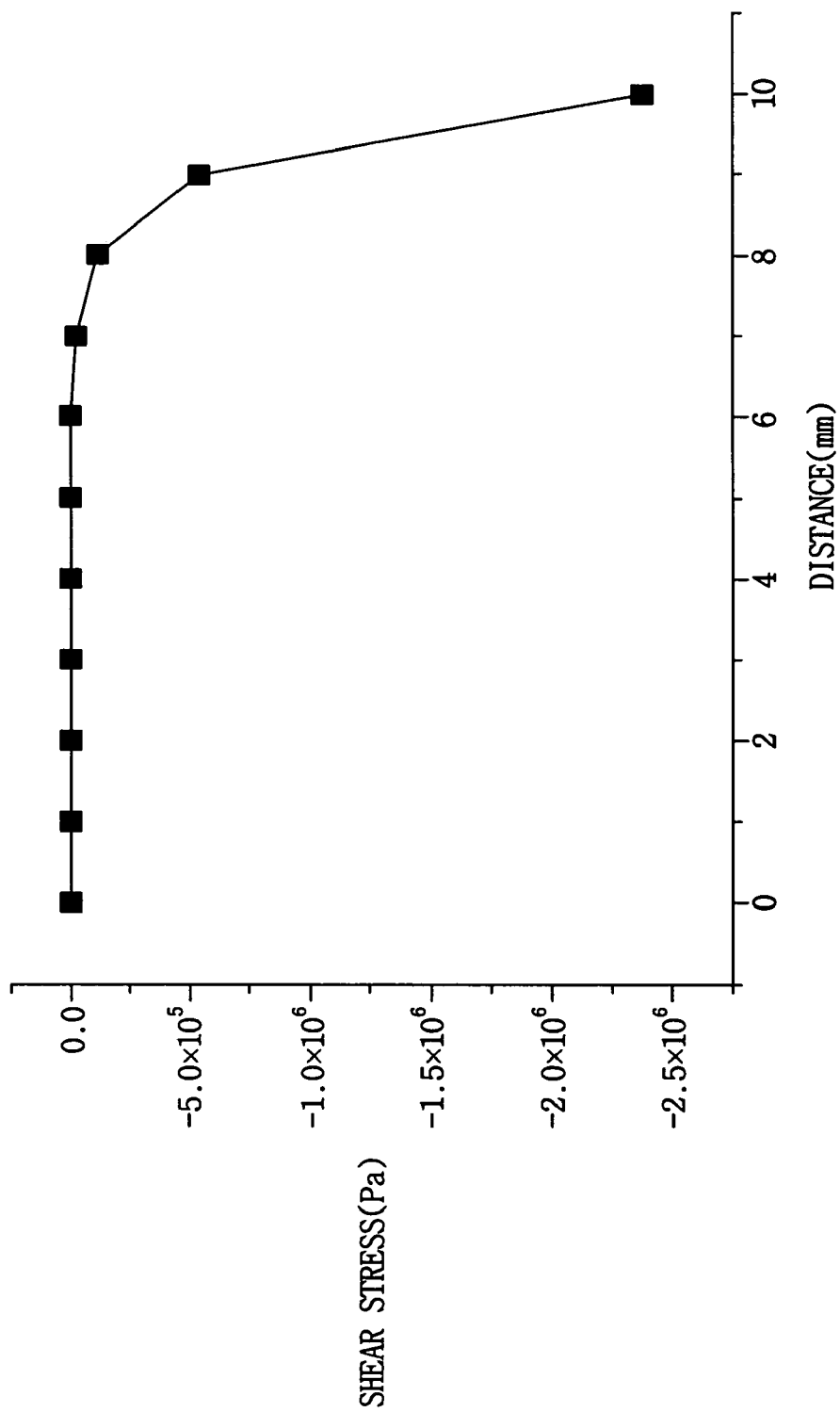
FIG. 2 is a graph showing a shear stress of the driver chip in FIG. 1.
Figure 3:
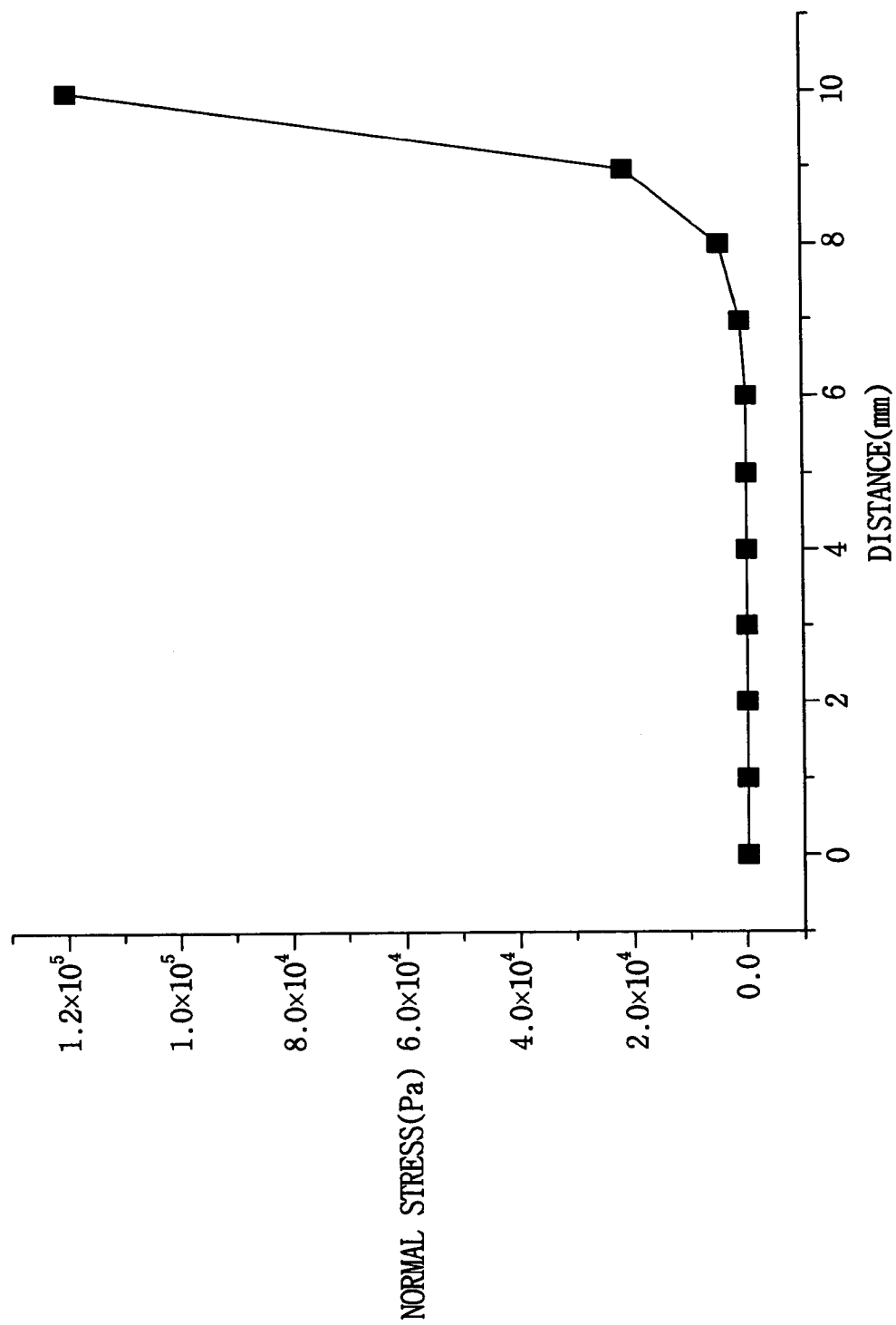
FIG. 3 is a graph showing a normal stress of the driver chip in FIG. 1.

FIG. 2 is a graph showing a shear stress of the driver chip in FIG. 1, and FIG. 3 is a graph showing a normal stress of the driver chip in FIG. 1. First and second long sides 110a and 110b of the driver chip in FIGS. 2 and 3 have a length of about 20 mm.

Referring to FIGS. 2 and 3, the shear stress applied to the driver chip 100 forms a plateau between 0 and about 8 mm, and the shear stress after passing a distance of about 8 mm rapidly drops. That is, no shear stress is applied when a distance between a center region and a region spaced apart from the center region is less than or equal to about 8 mm. However, when the distance between the center region and the region space apart from the center region is greater than about 8 mm, an amount of the shear stress increases rapidly. Especially, the shear stress is concentrated on the region that is spaced apart from the center region when the distance between the center region and the region spaced apart from the center region is in a range of about 9 mm to about 10 mm.

The normal stress that is applied to the driver chip 100 is similar to the shear stress. The normal stress applied to the driver chip 100 forms a plateau between 0 and about 8 mm, and the normal stress after passing a distance of about 8 mm rapidly increases. That is, no normal stress is applied when the distance between the center region and the region spaced apart from the center region is less than or equal to about 8 mm. However, when the distance between the center region and the region space apart from the center region is greater than about 8 mm, an amount of the normal stress increases rapidly.

As shown in FIGS. 2 and 3, the stress applied to the driver chip 100 is concentrated on a region of the first and second short sides 110c and 110d to lower reliability of electrical connection between the driver chip 100 and the display panel.

Figure 4:
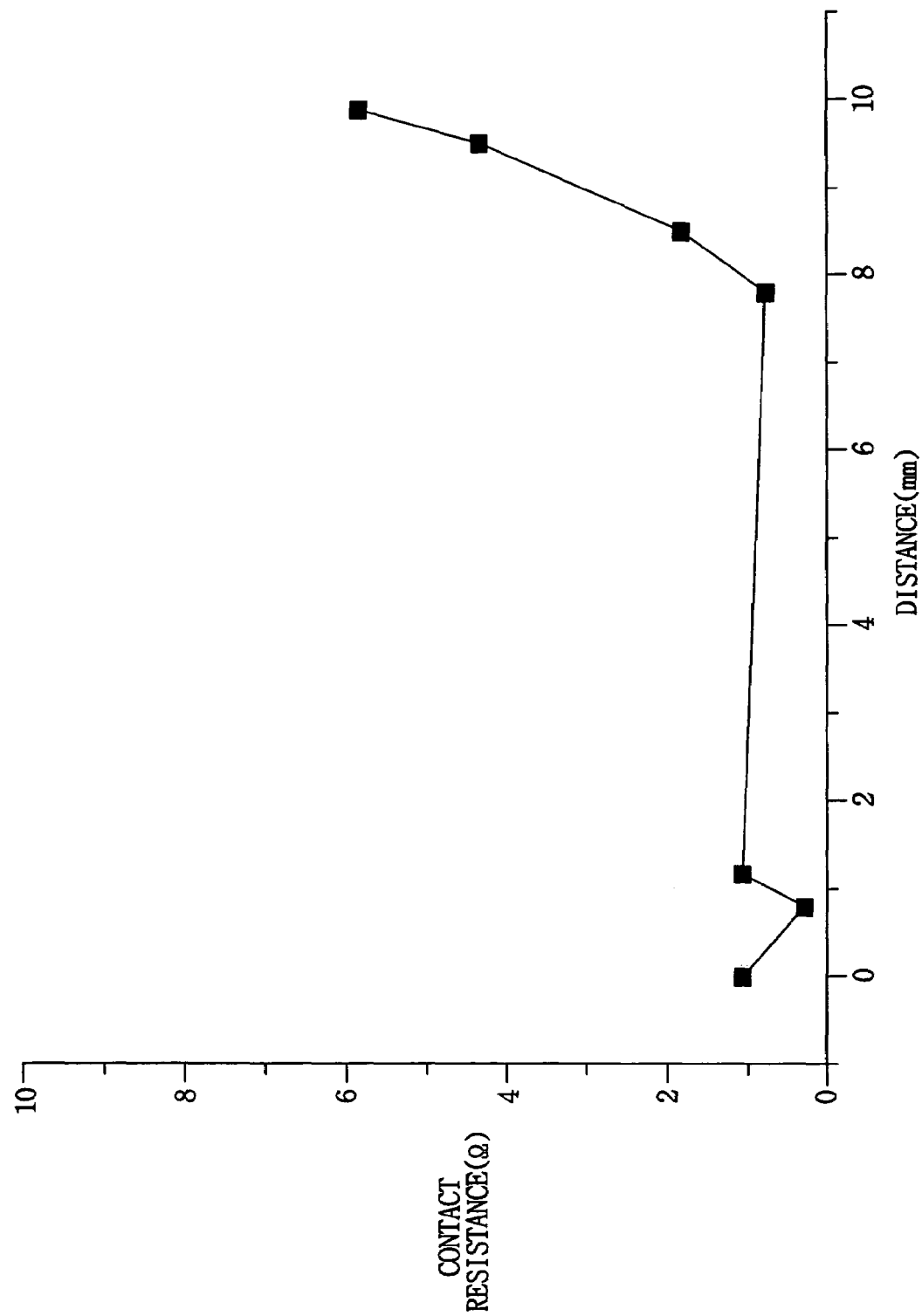
FIG. 4 is a graph showing a contact resistance between the driver chip in FIG. 1 and a liquid crystal display panel.

FIG. 4 is a graph showing a contact resistance between the driver chip in FIG. 1 and a liquid crystal display panel. The contact resistance is measured when the driver chip 100 undergoes a reliability test performed at a temperature of about 85° C. for 500 hours.

Referring to FIG. 4, the contact resistance does not change from 0 to about 8 mm, but the contact resistance increases when a contact resistance of the region is spaced apart from the center region by a distance greater than or equal about 8 mm. Particularly, the contact resistance of a region that is spaced apart from the center region by a distance greater than or equal to about 9 mm increases rapidly.

That is, when 'd' represents a distance between a center of the driver chip 100 and the first short side 110c, the stress is concentrated on a region from about 9d/10 to about d.

Therefore, the input terminal section 120 and the first output terminal section 130 are formed at a region undergoing relatively less stress, which is spaced apart from the center of the driver chip 100 by no more than about 9d/10. As a result, a reliability of electric connection between the driver chip 100 and the display panel is enhanced.

Figure 5:
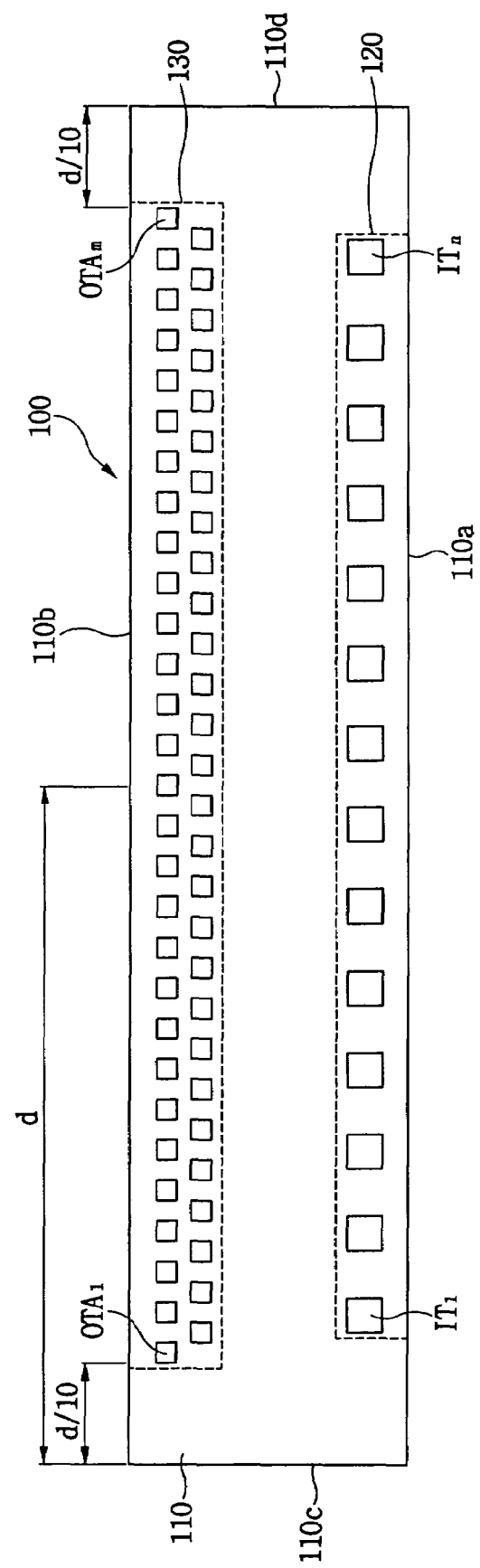
FIG. 5 is a plan view illustrating the driver chip in FIG. 1.

FIG. 5 is a plan view illustrating the driver chip in FIG. 1.

Referring to FIG. 5, an input terminal section 120 and a first output terminal section 130 are formed on a surface of the base body 110.

The input terminal section 120 is formed at a first edge portion along a first long side 110a. A portion of the input terminal section 120 is formed in a region within about 9d/10 from a center toward a first short side 110c along the first long side 110a, and a remaining portion of the input terminal section 120 is formed in a region within about 9d/10 from a center toward a second short side 110d along the first long side 110a, wherein 'd' is a distance from a center of the first long side 110a or the second long side 110b to the first short side 110c or the second short side 110d.

The first output terminal section 130 is formed at a second edge portion that is spaced apart from the first edge portion. A portion of the first output terminal section 130 is formed in a region within about 9d/10 from a center toward the first short side 110c along the second long side 110b, and a remaining portion of the first output terminal section 130 is formed in a region within about 9d/10 from a center toward the second short side 110d along the second long side 110b. That is, a first terminal $OTA_1$ of the first output terminal section 130, which is adjacent to the first short side 110c, is spaced apart from the first short side 110c by a distance greater than about d/10. A last terminal $OTA_m$ that is adjacent to the second short side 110d is spaced apart from the second short side 110d by a distance greater than or equal to about d/10.

Embodiment 2

Figure 6:
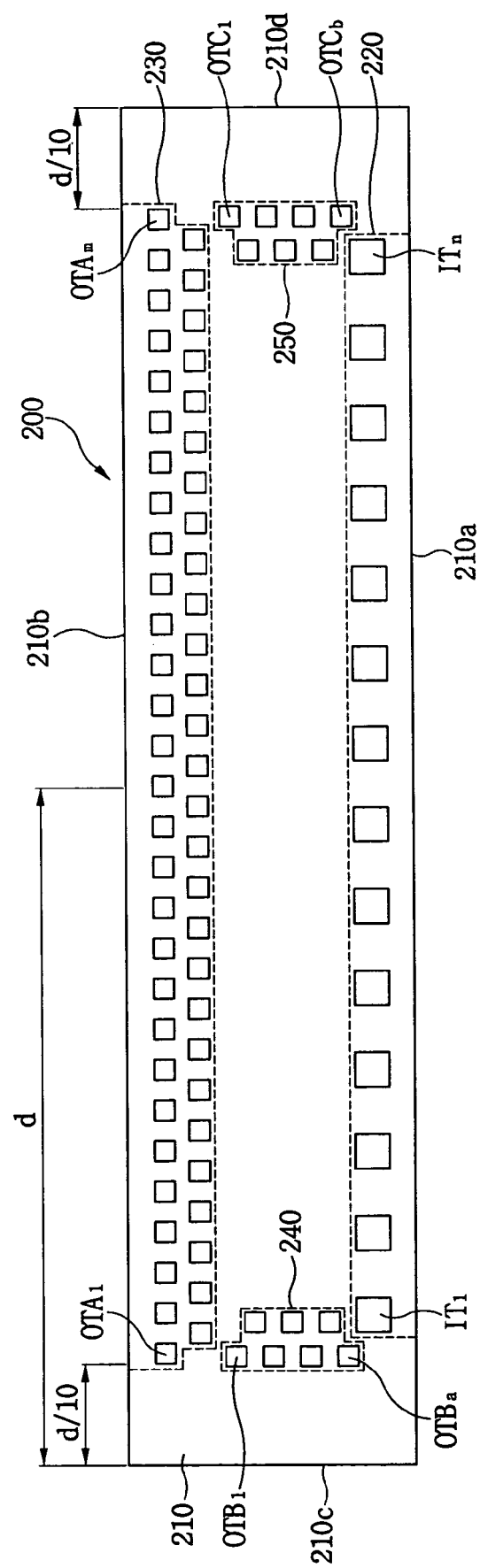
FIG. 6 is a plan view illustrating a driver chip according to a second exemplary embodiment of the present invention.

FIG. 6 is a plan view illustrating a driver chip according to a second exemplary embodiment of the present invention.

Referring to FIG. 6, a driver chip 200 according to a second exemplary embodiment of the present invention includes a base body 210, an input terminal section 220, a first output terminal section 230, a second output terminal section 240 and a third output terminal section 250. The base body 210, the input terminal section 220 and the first output terminal section 230 are substantially same as those of the driver chip 100 in FIG. 5. Thus, any further explanation with regard to these members will be omitted.

The second output terminal section 240 is formed at a third end portion that is substantially perpendicular to the first end portion. The second output terminal section 240 is formed along a first short side 210c. The second output terminal section 240 may have substantially same height as that of the first output terminal section 230. The second output terminal section 240 includes a-number of second output terminals $OTB_1$ to $OTB_a$, wherein 'a' is a natural number no less than 2. The second output terminals $OTB_1$ to $OTB_a$ are arranged in two lines at the third end portion along the first short side 210c. The second output terminal section 240 is disposed within about 9d/10 from a center of first and second long sides 210a and 210b toward the first short side 210c. That is, the second output terminal section 240 is spaced apart from the first short side 210c by about no less than d/10.

The third output terminal section 250 is formed at a fourth end portion that is spaced apart from the third end portion. The third output terminal section 250 is formed along a second short side 210d. The third output terminal section 250 may have substantially same height as that of the second output terminal section 240. The third output terminal section 250 includes b-number of third output terminals $OTC_1$ to $OTC_b$, wherein 'b' is a natural number no less than 2. The third output terminals $OTC_1$ to $OTC_b$ are arranged in two lines at the fourth end portion along the second short side 210d. The third output terminal section 250 is disposed within about 9d/10 from a center of first and second long sides 210a and 210b toward the second short side 210d. That is, the third output terminal section 250 is spaced apart from the second short side 210d by about no less than d/10.

For example, the second output terminals $OTB_1$ to $OTB_a$ and the third output terminals $OTC_1$ to $OTC_b$ of the second and third output terminal sections 240 and 250, respectively, are arranged in two lines. However, the second output terminals $OTB_1$ to $OTB_a$ and the third output terminals $OTC_1$ to $OTC_b$ may be arranged in a single line or more than two lines.

Embodiment 3

Figure 7:
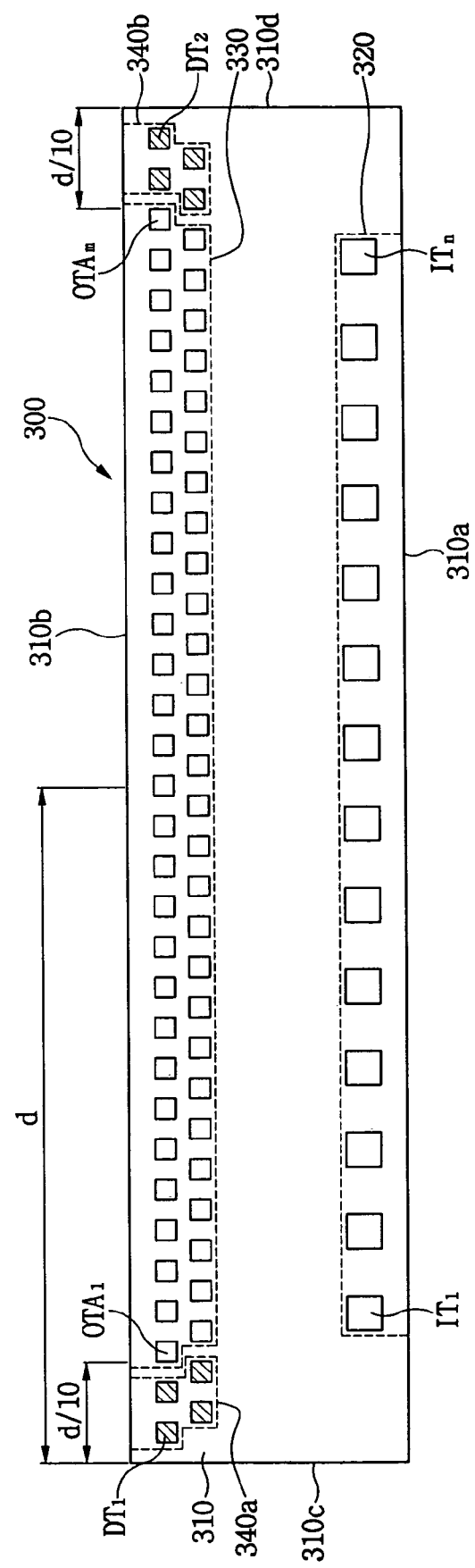
FIG. 7 is a plan view illustrating a driver chip according to a third exemplary embodiment of the present invention.

FIG. 7 is a plan view illustrating a driver chip according to a third exemplary embodiment of the present invention.

Referring to FIG. 7, a driver chip 300 according to a third exemplary embodiment of the present invention includes a base body 310, an input terminal section 320, a first output terminal section 330, and first and second dummy terminal sections 340a and 340b. The base body 310 includes first and second long sides 310a and 310b, and first and second short sides 310c and 310d that are substantially perpendicular to the first and second long sides 310a and 310b. The base body 310, the input terminal section 320 and the first output terminal section 330 are substantially same as those of the driver chip 100 in FIG. 5. Thus, any further explanation with regard to these members will be omitted.

The first dummy terminal section 340a has substantially same height that is from a surface of the base body 310 as that of the first output terminal section 330. The first dummy terminal section 340a is extended from a first end of the first output terminal section 330 along a second long side 310b to be disposed near a first short side 310c. The first dummy terminal section 340a includes a plurality of first dummy terminals $DT_1$. The first dummy terminals $DT_1$ are arranged in two lines, which is similar to an arrangement of the first output terminals $OTA_1$ to $OTA_m$. The first dummy terminal section 340a is formed in a region that is spaced apart from the first short side 310c toward a center of the second long side 310b by no more than about d/10.

The second dummy terminal section 340b has substantially same height that is from a surface of the base body 310 as that of the first output terminal section 330. The second dummy terminal section 340b is extended from a second end of the first output terminal section 330 along a second long side 310b to be disposed near a second short side 310d. The second dummy terminal section 340b includes a plurality of second dummy terminals $DT_2$. The second dummy terminals $DT_2$ are arranged in two lines like the arrangement of the first output terminals $OTA_1$ to $OTA_m$. The second dummy terminal section 340b is formed in a region that is spaced apart from the second short side 310d toward a center of the second long side 310b by no more than about d/10.

No electric signal is applied to the first and second dummy terminal sections 340a and 340b. The first and second dummy terminals $DT_1$ and $DT_2$ may have a substantially identical shape with the first output terminals $OTA_1$ to $OTA_m$. However, the first and second dummy terminals $DT_1$ and $DT_2$ may have a different shape from that of the first output terminals $OTA_1$ to $OTA_m$.

According to the present embodiment, the driver chip 300 further includes the first and second dummy terminal sections 340a and 340b that are formed in a region on which stresses are concentrated. The first and second dummy terminal sections 340a and 340b buffer or absorb the stresses to enhance reliability of connection between the driver chip 300 and a display panel.

Embodiment 4

Figure 8:
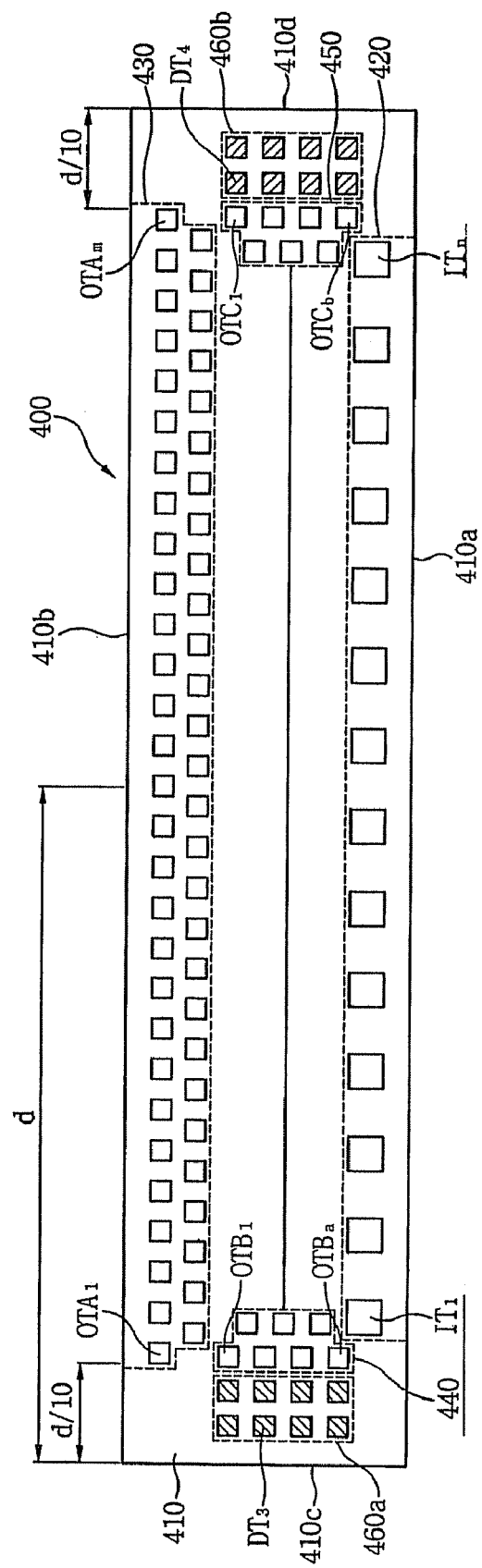
FIG. 8 is a plan view illustrating a driver chip according to a fourth exemplary embodiment of the present invention.

FIG. 8 is a plan view illustrating a driver chip according to a fourth exemplary embodiment of the present invention.

Referring to FIG. 8, a driver chip 400 according to a fourth exemplary embodiment of the present invention includes a base body 410, an input terminal section 420, a first output terminal section 430, a second output terminal section 440, a third output terminal section 450, and first and second dummy terminal sections 460a and 460b. The base body 410 includes first and second long sides 410a and 410b, and first and second short sides 410c and 410d that are substantially perpendicular to the first and second long sides 410a and 410b. The base body 410, the input terminal section 420 and the first, second and third output terminal sections 430, 440 and 450 are substantially same as those of the driver chip 200 in FIG. 6. Thus, any further explanation will be omitted.

The third dummy terminal section 460a has substantially same height as that of the second output terminal section 440, and the third dummy terminal section 460a is interposed between a first short side 410c and the second output terminal section 440. In detail, the third dummy terminal section 460a is formed in a region on which stresses are concentrated. Particularly, the third dummy terminal section 460a is formed in a region that is spaced apart from the first short side 410c toward a center of the driver chip 400 by no more than about d/10. The third dummy terminal section 460a includes a plurality of third dummy terminals $DT_3$. No electric signal is applied to the third dummy terminals $DT_3$.

The fourth dummy terminal section 460b has substantially same height as that of the third output terminal section 450, and the fourth dummy terminal section 460b is interposed between a second short side 410d and the third output terminal section 450. In detail, the fourth dummy terminal section 460b is formed in a region on which stresses are concentrated. More specifically, the fourth dummy terminal section 460b is formed in a region that is spaced apart from the second short side 410d toward a center of the driver chip 400 by no more than about d/10. The fourth dummy terminal section 460b includes a plurality of fourth dummy terminals $DT_4$. No electric signal is applied to the fourth dummy terminals $DT_4$.

The third and fourth dummy terminals $DT_3$ and $DT_4$ may be arranged in two lines. However, the third and fourth dummy terminals DT3 and DT4 may be arranged in a single line or more than two lines.

Hereinbefore, driver chips according to exemplary embodiments of the present invention are explained. Hereinafter, a display apparatus employing the driver chips will be explained.

Embodiments of Display Apparatus

Embodiment 5

Figure 9:
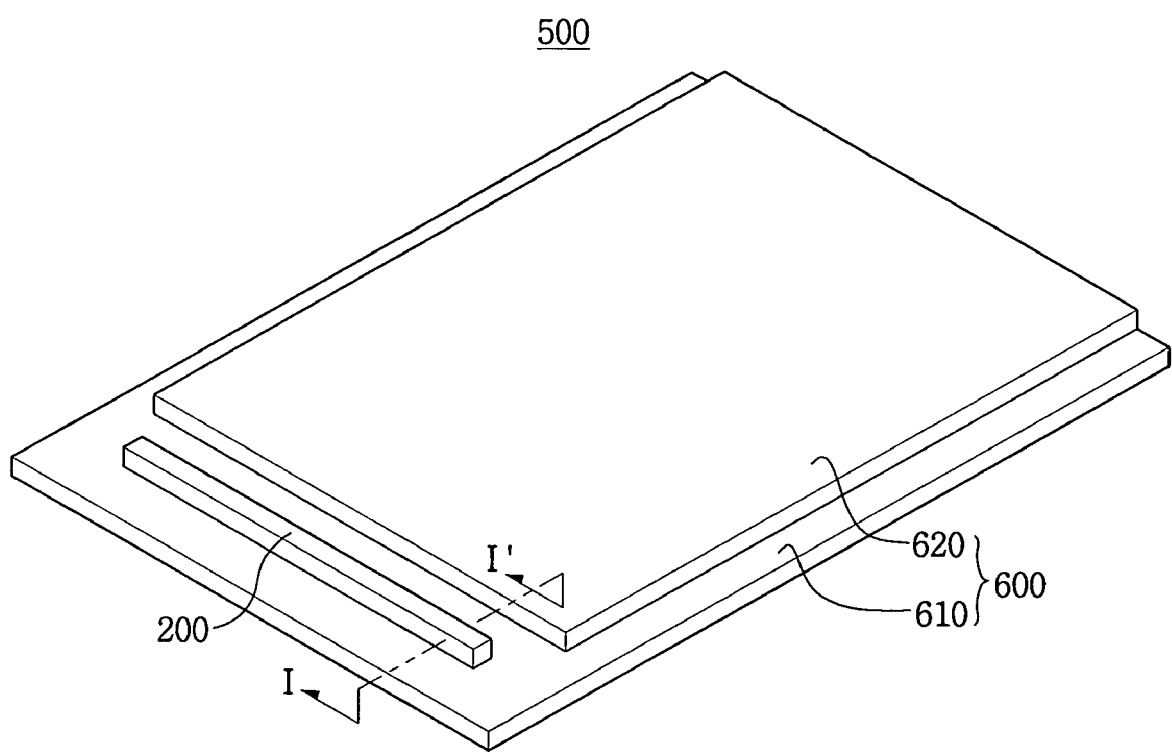
FIG. 9 is a perspective view illustrating a display apparatus according to a fifth exemplary embodiment of the present invention.
Figure 10:
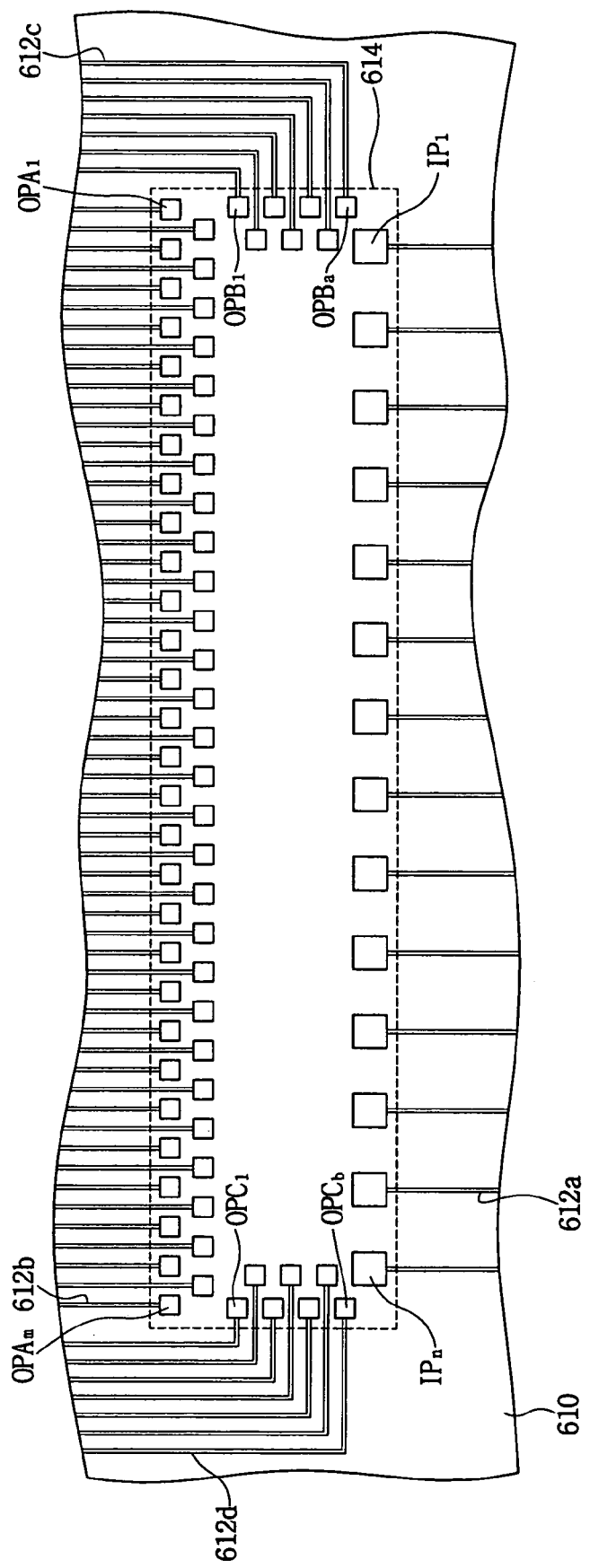
FIG. 10 is an enlarged view of a pad region of a first substrate in FIG. 9.

FIG. 9 is a perspective view illustrating a display apparatus according to a fifth exemplary embodiment of the present invention, and FIG. 10 is an enlarged view of a pad region of a first substrate in FIG. 9.

Referring to FIGS. 9 and 10, a display apparatus 500 according to a fifth exemplary embodiment of the present invention includes a driver chip 200 and a display panel 600. The driver chip 200 is same as the driver chip 200 in FIG. 6. Thus, any further explanation concerning the driver chip 200 will be omitted.

The display panel 600 includes a first substrate 610, a second substrate 620 facing the first substrate 610, and a liquid crystal (not shown) interposed between the first and second substrates 610 and 620.

The first substrate 610 includes a plurality of conducting lines 612 for transferring electric signals, and a pad section 614 for electrically connecting between the driver chip 200 and the conducting lines 612.

The conducting lines 612 include an input line 612a and a first output line 612b. The input line 612a is electrically connected to a flexible printed circuit (FPC) in order to receive external input signal. The first output line 612b is electrically connected to gate lines (not shown) and data lines (not shown). The gate lines and the data lines are formed on the first substrate 610. The gate lines are substantially perpendicular to the data lines.

The conducting lines 612 may further include a second output line 612c and a third output line 612d. The second and third output lines 612c and 612d are electrically connected to the gate lines and the data lines.

The pad section 614 includes a plurality of input pads $IP_1$ to $IP_n$, and first output pads $OPA_1$ to $OPA_m$.

The input pads $IP_1$ to $IP_n$ are electrically connected to the input line 612a on the first substrate 610. The input pads $IP_1$ to $IP_n$ correspond to the input terminal $IT_1$ to $IT_n$ of the driver chip 200 in one to one manner, so that the external signals applied to the input line 612a are transferred to the driver chip 200 via the input pads $IP_1$ to $IP_n$.

The first output pads $OPA_1$ to $OPA_m$ are electrically connected to the first output line 612b on the first substrate 610. The first output pads $OPA_1$ to $OPA_m$ correspond to the first output terminals $OTA_1$ to $OTA_m$ in one to one manner, so that output signals outputted from the driver chip 200 are transferred to the gate line and the data line through the first output line 612b.

The pad section 614 may further include second output pads $OPB_1$ to $OPB_a$, and third output pads $OPC_1$ to $OCP_b$.

The second output pads $OPB_1$ to $OPB_a$ are formed between the input pads $IP_1$ to $IP_n$, and the first output pads $OPA_1$ to $OPA_m$, such that the second output pads $OPB_1$ to $OPB_a$ are disposed at a first edge portion of the input pads $IP_1$ to $IP_n$, and the first output pads $OPA_1$ to $OPA_m$. The second output pads $OPB_1$ to $OPB_a$ are electrically connected to the second output line 612c. The second output pads $OPB_1$ to $OPB_a$ correspond to the second output terminals $OTB_1$ to $OTB_a$ in one to one manner.

The third output pads $OPC_1$ to $OPC_b$ are formed between the input pads $IP_1$ to $IP_n$, and the first output pads $OPA_1$ to $OPA_m$, such that the second output pads $OPB_1$ to $OPB_a$ are disposed at a second edge portion of the input pads $IP_1$ to $IP_n$, and the first output pads $OPA_1$ to $OPA_m$. The third output pads $OPC_1$ to $OPC_b$ are electrically connected to the third output line 612d. The third output pads $OPC_1$ to $OPC_b$ correspond to the third output terminals $OTC_1$ to $OTC_b$ in one to one manner.

The driver chip 200 is electrically connected to the pad section 614 having above explained structure.

Figure 11:
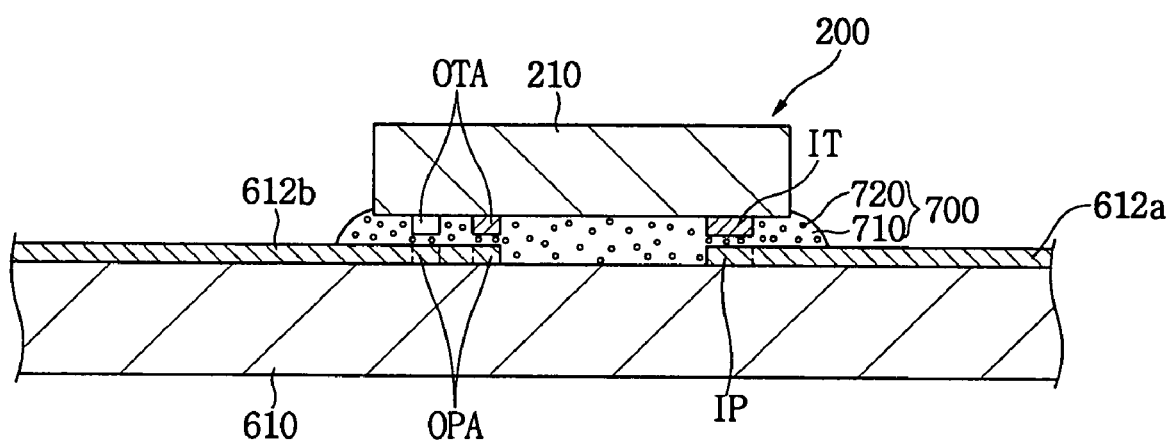
FIG. 11 is a cross-sectional view taken along a line I-I' in FIG. 9.

FIG. 11 is a cross-sectional view taken along a line I-I' in FIG. 9.

Referring to FIG. 11, a driver chip 200 is mounted on the pad section 614 through COG process. That is, an anisotropic conductive film (ACF) 700 is interposed between the driver chip 200 and the first substrate 610, so that the driver chip 200 is combined with the first substrate 610 by compression at high temperature.

The ACF 700 includes a resin 710 and a plurality of conductive particles 720 distributed randomly in the resin 710.

The conductive particles 720 have a spherical shape. The conductive particles 720 interposed between the input terminal IT and the input pad IP are connected to each other by compression, so that the input terminal IT and the input pad IP are electrically connected to each other. The conductive particles 720 interposed between the first output terminal OTA and the first output pad OPA are connected to each other by compression, so that the first output terminal OTA and the first output pad OPA are electrically connected to each other.

The resin 710 corresponds to a thermosetting plastic. Therefore, the resin 710 is hardened to fix the driver chip 200 and the first substrate 610 when electrical connection between the input terminal IT and the input pad IP or between the first output terminal OTA and the first output pad OPA is completed.

Although not shown in FIG. 11, the second output terminal OTB and the second output pad OPB are electrically connected to each other by the conductive particles 720, and third output terminal OTC and the third output pad OPC are also electrically connected to each other by the conductive particles 720.

For example, the display panel 600 corresponds to a liquid crystal display panel. However, a plasma display panel (PDP), an electroluminescence (EL), etc., may be employed as the display panel 600.

According to the present invention, input terminals and output terminals are formed on other region than an edge portion of a base body, on which stress is concentrated. Therefore, a reliability of electric connection between the driver chip and a display panel is enhanced.

Having described the exemplary embodiments of the present invention and its advantages, it is noted that various changes, substitutions and alterations can be made herein without departing from the spirit and scope of the invention as defined by appended claims.

What is claimed is:

1. A driver chip comprising:
   a base body including a face having a long side and a short side;
   an input terminal section formed at a first edge portion of the face along the long side; and
   a first output terminal section formed at a second edge portion that is opposite to the first edge portion along the short side, the first output terminal section being formed along the long side,
   wherein the input terminal section and the first output terminal section are disposed within about 9d/10 from a center of the long side toward the short side, in which 'd' represents a distance between the center of the long side and the short side.

2. The driver chip of claim 1, wherein the first output terminal section comprises a plurality of first output terminals arranged in plural lines, each of the plural lines of the first output terminal section extending along the long side of the base body, the plural lines being arranged in a direction along the short side.

3. The driver chip of claim 1, wherein the first output terminal section comprises a plurality of first output terminals arranged in two lines, each of the two lines of the first output terminal section extending along the long side of the base body, the two lines being arranged in a direction along the short side.

4. The driver chip of claim 3, wherein the first output terminals arranged in a first line are spaced apart from each other, and each of the first output terminals arranged in a second line that is substantially parallel with the first line is disposed between the first output terminals arranged in the first line.

5. The driver chip of claim 1, further comprising:
   a second output terminal section formed at a third edge portion that is substantially perpendicular to the first edge portion along the short side; and
   a third output terminal section formed at a fourth edge portion that is opposite to the third edge portion along the long side, the third output terminal section being formed along the short side.

6. The driver chip of claim 5, wherein the second and third output terminal sections are formed within about 9d/10 from the center of the long side toward the short side.

7. The driver chip of claim 6, wherein the second and third output terminal sections are arranged in plural lines, each of the plural lines of the second and third output terminal sections, respectively, extending along the short side of the base body and arranged in a direction along the long side.

8. The driver chip of claim 5, further comprising first and second dummy terminal sections spaced apart from the third and fourth edge portion by no more than about d/10, respectively.

9. The driver chip of claim 1, further comprising a dummy terminal section formed at a side of the first output terminal section.

10. The driver chip of claim 9, wherein the dummy terminal section is disposed within about d/10 from the short side toward the center of the long side.

11. A driver chip comprising:
    a base body including a long side and a short side that is substantially perpendicular to the long side;
    an input terminal section formed at a first edge of the base body along the long side;
    a first output terminal section formed at a second edge that is opposite to the first edge along the short side, the first output terminal section being formed along the long side; and
    a dummy terminal section that formed at a side of the first output terminal section along the long side;
    wherein the input terminal section and the first output terminal section are disposed within 9d/10 from a center of the long side toward the short side, in which 'd' represents a distance between the center of the long side and the short side.

12. The driver chip of claim 11, wherein the dummy terminal section is disposed within d/10 from the short side toward the center of the long side.

13. The driver chip of claim 11, wherein the first output terminal section includes a plurality of first output terminals arranged in plural lines, each of the plural lines extending along the long side of the base body, the plural lines being arranged in a direction along the short side.

14. A display apparatus comprising:
    a driver chip comprising:
    a base body including a face having a long side and a short side;
    an input terminal section formed at a first edge portion of the face along the long side; and
    a first output terminal section formed at a second edge portion that is opposite to the first edge portion along the short side, the first output terminal section being formed along the long side,
    wherein the input terminal section and the first output terminal section are disposed within about 9d/10 from a center of the long side toward the short side, in which 'd' represents a distance between the center of the long side and the short side; and
    a display panel including a conducting line for transferring an electric signal and a pad section through which the driver chip is electrically connected to the conducting line.

15. The display apparatus of claim 14, wherein the pad section comprises:
    an input pad that is electrically connected to the input terminal section to apply an external input signal to the driver chip; and
    an output pad that is electrically connected to the first output terminal section to apply an output signal outputted from the driver chip to the display panel.

16. The display apparatus of claim 14, wherein the driver chip further comprises a first dummy output terminal disposed at each side of the first output terminal section along the long side.

17. The display apparatus of claim 14, wherein the driver chip further comprises:
   a second output terminal section formed at a third edge portion that is substantially perpendicular to the first edge portion along the short side; and
   a third output terminal section formed at a fourth edge portion that is opposite to the third edge portion along the long side, the third output terminal section being formed along the short side.

18. The display apparatus of claim 17, wherein the second and third output terminal sections are disposed within 9d/10 from the center of the long side toward the short side.

19. The display apparatus of claim 18, wherein the driver chip further comprises a second dummy terminal section disposed between the second and third output terminal sections and each short side.

20. The display apparatus of claim 18, wherein the first, second and third output terminal sections include first, second and third output terminals arranged in plural lines, respectively,
   wherein each of the plural lines of the first output terminal section extends along the long side of the base body and is arranged in a direction along the short side, and
   wherein each of the plural lines of the second and third output terminal section extends along the short side of the base body and is arranged in a direction along the long side.

21. The display apparatus of claim 14, wherein the driver chip is electrically connected to the display panel via an anisotropic conductive film.

22. The display apparatus of claim 14, wherein the display panel corresponds to a liquid crystal display panel that displays images by using liquid crystal.

* * * * *